United States Patent [19]

Ohno et al.

[11] Patent Number: 5,140,300
[45] Date of Patent: Aug. 18, 1992

[54] SUPERCONDUCTIVE MAGNETO-RESISTIVE DEVICE COMPRISING LAMINATED SUPERCONDUCTIVE CERAMIC FILMS

[75] Inventors: Eizo Ohno; Hideo Nojima; Masaya Nagata; Shuhei Tsuchimoto, all of Nara, Japan

[73] Assignee: Sharp Kabushiki Kaisha, Osaka, Japan

[21] Appl. No.: 742,284

[22] Filed: Aug. 8, 1991

Related U.S. Application Data

[63] Continuation of Ser. No. 423,774, Oct. 17, 1989, abandoned.

[30] Foreign Application Priority Data

Oct. 24, 1988 [JP] Japan .................. 63-268586

[51] Int. Cl.$^5$ ............... H01L 39/00; H01L 43/00; H01C 1/012
[52] U.S. Cl. ...................... 338/325; 505/1; 505/701; 505/881; 338/308; 428/930
[58] Field of Search .............. 338/325, 308, 314; 29/559; 335/216; 361/19, 276; 324/207.21, 248, 249, 252; 428/930, 931, 210, 688, 689, 192, 433; 505/881-884, 886, 887, 701, 700, 741

[56] References Cited

U.S. PATENT DOCUMENTS

| | | | |
|---|---|---|---|
| 3,359,516 | 12/1967 | Swartz et al. | 338/32 S |
| 3,391,362 | 7/1968 | Albrecht et al. | 338/32 S |
| 3,649,891 | 3/1972 | Lawless | 361/282 X |
| 4,897,378 | 1/1990 | Chiang | 505/1 |
| 4,937,226 | 6/1990 | Nishiguchi | 505/1 |
| 4,954,480 | 9/1990 | Imanaka et al. | 428/930 X |
| 4,957,901 | 9/1990 | Jacobson et al. | 505/1 |
| 4,962,085 | 10/1990 | deBarbadillo, II et al. | 505/1 |

FOREIGN PATENT DOCUMENTS

| | | | |
|---|---|---|---|
| 63-276243 | 11/1988 | Japan | 505/701 |
| 64-76912 | 3/1989 | Japan | 505/701 |
| 1-130420 | 5/1989 | Japan | 505/701 |

OTHER PUBLICATIONS

"Galvanomagnetic Effect of an Y-Ba-Cu-O Ceramic Superconductor and Its Application to Magnetic Sensors", by Hideo Nojima et al., Japanese Journal of Applied Physics, vol. 27, No. 5, May 1988, pp. 74-78.

IEEE Transactions on Magnetics, vol. 25, No. 2, Mar. 1989, pp. 954-956, G. K. G. Hohenwarter et al.: "Single Superconducting Thin Film Devices for Applications in High Tc Materials Circuits", p. 955,.FIG. 1, paragraph 2; p. 956, right-hand side column.

Japanese Journal of Applied Physics, vol. 27, No. 5, May 1988, pp. 746-750, Tokyo, H. Nojima et al.: "Galvanomagnetic Effect of an Y-Ba-Cu-O Ceramic Superconductor and Its Application to Magnetic Sensors", p. 748, paragraph 2; p. 749, full page.

Journal of Physics E-Scientific Instruments, vol. 19, No. 7, Jul. 1986, pp. 502-515, The Institute of Physics, W. Kwaitkowski et al.: "The Permalloy Magnetoresistive Sensors-Properties and Applications", p. 509, right-hand column.

Proceedings of the International Electron Devices Meeting, H. Nojima et al.: "Improvement in Sensitivity of Novel Magnetic Sensor Using Y-Ba-Cu-O Ceramic Superconductor Film" pp. 892-893, Dec. 1988.

WO-A-8 905 044, (Heidelberg Motor), p. 4, paragraph 1; p. 6, paragraph 3, FIG. 1, Jun. 1989.

Translation of Japanese Patent Laid Open Publication No. 65582/1985.

"Novel Magnetic Sensor Using Y-Ba-Cu-O Ceramic Superconductor: Super Magneto-Resistor" by S. Tsuchimoto et al., 1987 IEEE, pp. 867-868.

Highly Sensitive Magnetic Sensor Using $Y_1Ba_2Cu_3O_{7-x}$ Films, 5th Int'l Workshop on Future Electron Devices—High Temperature Superconducting Electron Devices—(FED HiTcSc-ED Workshop), Jun. 2-4, 1988, Miyagi-Zao, pp. 231-234.

*Primary Examiner*—Marvin M. Lateef

[57] ABSTRACT

A superconductive magneto-resistive device includes superconductive ceramic films having a magneto-resistive effect. In the superconductive magneto-resistive device, the superconductive ceramic films are laminated one by one, and the adjacent superconductive ceramic films are insulated by each electrical insulation film, respectively, except for one portion of each of the adjacent superconductive ceramic films, resulting in that the superconductive ceramic films are connected in series. Furthermore, a pair of electrodes is arranged on the upper-most and lower-most superconductive ceramic films.

34 Claims, 5 Drawing Sheets

SUPERCONDUCTIVE MAGNETO-RESISTIVE DEVICE COMPRISING LAMINATED SUPERCONDUCTIVE CERAMIC FILMS

This application is a continuation of application Ser. No. 07/423,774, filed on Oct. 17, 1989, now abandoned.

BACKGROUND OF THE INVENTION

1. Field of the Invention

The present invention relates to a superconductive magneto-resistive device, and more particularly, to a superconductive magneto-resistive device comprising laminated superconductive ceramic films.

2. Description of Related Art

Figure 1:
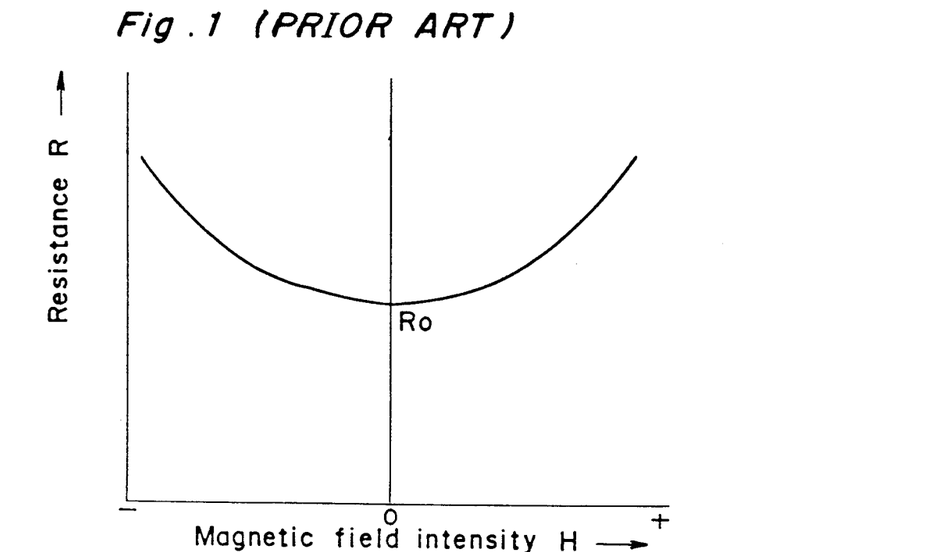
FIG. 1 is a graph showing a magnetic field detection characteristic of a conventional magnetic sensor utilizing a magneto-resistive device.

Conventionally, a magnetic sensor utilizing a magneto-resistive device made of a semiconductor or a magnetic material has been widely used for measuring a magnetic field. In this sort of magnetic sensor, a device utilizing a form effect such as a semiconductor of InSb, InAs etc. having a high electron mobility and a device utilizing an orientation effect such as a ferromagnetic material of Fe-Ni (permalloy), Co-Ni etc. have been put to practical use. In the conventional magnetic sensor utilizing the magneto-resistive device, the resistance R of the magneto-resistive device increases along a parabolic curve as shown in FIG. 1 when a magnetic field intensity H to be measured is changed in such a state that a constant current I is supplied thereto. Therefore, when the magnetic field intensity H is relatively low, the precision upon measuring a relatively low magnetic field intensity H is lowered since the variation ratio of the resistance to the magnetic field intensity is relatively small.

Further, the SQUID (Superconductive Quantum Interference Device) has been used as a magnetic sensor. The SQUID has an extremely high sensitivity to measure a low magnetic field of about $10^{-10}$ gauss and utilizes the Josephson device wherein an extremely thin insulation film is arranged between superconductive films. However, there are such disadvantages that it is difficult to make the Josephson device since it is made by using a difficult technique and it is necessary to amplify a voltage generated therein since the level of the output voltage is relatively low.

Furthermore, a magnetic sensor utilizing a magneto-resistive device of superconductive ceramic films comprised of grain boundaries has been proposed by the present applicants. In this sort of magnetic sensor, there is used either a superconductive ceramic film comprised of grain boundaries which either an insulation film where grain boundaries of a superconductor are extremely close to each other or a normal conductive film is arranged, or a superconductive ceramic film comprised of grain boundaries which are supposed to form point type weak couplings. Even though a relatively low magnetic field is applied to the ceramic superconductor, some of the superconductive state of the above grain boundaries are broken, resulting in that the ceramic superconductor becomes the normal conductive phase from the superconductive phase, and the ceramic superconductor has an electric resistance.

Figure 2:
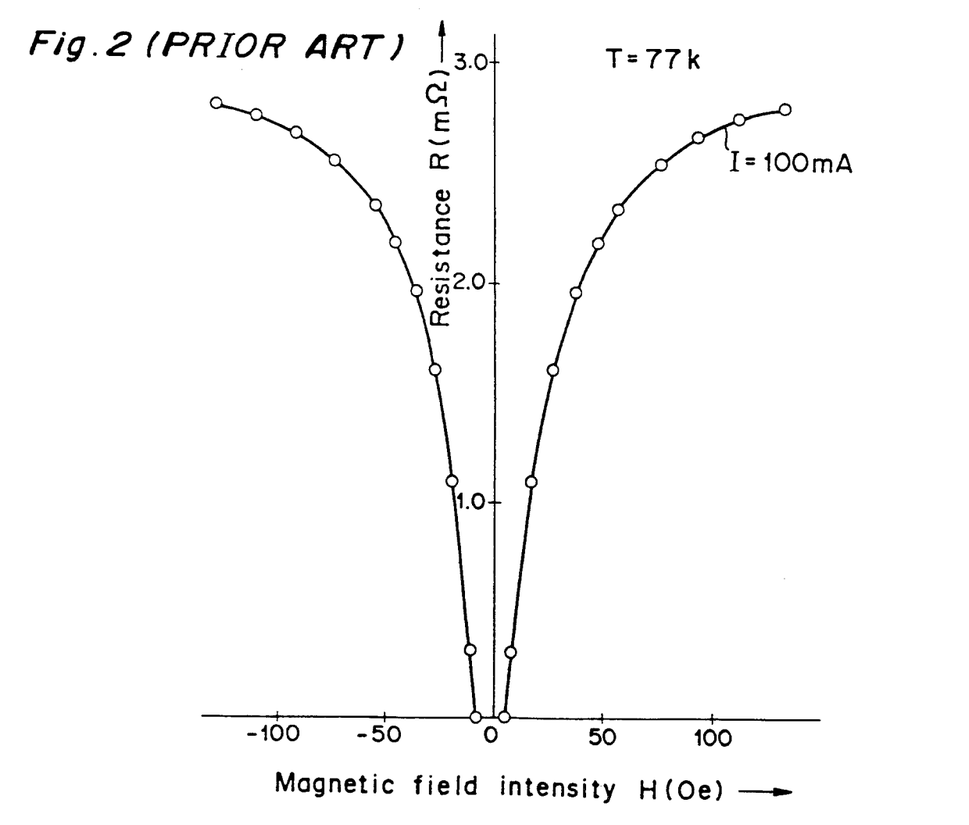
FIG. 2 is a graph showing a magnetic field detection characteristic of a conventional magnetic sensor utilizing a superconductive magneto-resistive device which is made by a method for sintering powders of compounds of a superconductor so as to form a superconductive element to be used for a magnetic sensor.

FIG. 2 shows a magneto-resistive characteristic of the above magnetic sensor utilizing the above ceramic superconductor having weak couplings between the grain boundaries, the ceramic superconductor being made by a conventional method for sintering powders of the materials thereof.

As shown in FIG. 2, when a relatively low magnetic field is applied to the ceramic superconductor, some of the above weak couplings between the grain boundaries at the superconductive state are broken, and the resistance thereof increases steeply according to the increase of the magnetic field intensity. This implies that the magnetic sensor utilizing the ceramic superconductor has a high sensitivity even though a relatively low magnetic field is applied thereto.

SUMMARY OF THE INVENTION

An essential object of the present invention is to provide a superconductive magneto-resistive device having a high sensitivity for measuring a relatively low magnetic field.

In order to accomplish the above object, according to the present invention, there is provided a superconductive magneto-resistive device comprising: a block-shaped ceramic superconductor made of superconductive ceramic films having a magneto-resistive effect on which the resistance thereof varies according to a magnetic field intensity being applied thereto. The superconductive ceramic films are laminated. The adjacent superconductive ceramic films are insulated from each other by an electrical insulation film, respectively, except for one portion of each of the adjacent superconductive ceramic films. One end portion of each of the superconductive ceramic films is connected to the superconductive ceramic film laminated on the upper surface thereof, and another end portion of each of the superconductive ceramic films being connected to said superconductive ceramic film laminated on the lower surface thereof, thereby connecting the superconductive ceramic films in series. A pair of electrodes are arranged on the upper-most and lower-most superconductive ceramic films.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

A preferred embodiment according to the present invention will be described below with reference to the attached drawings.

Figure 3:
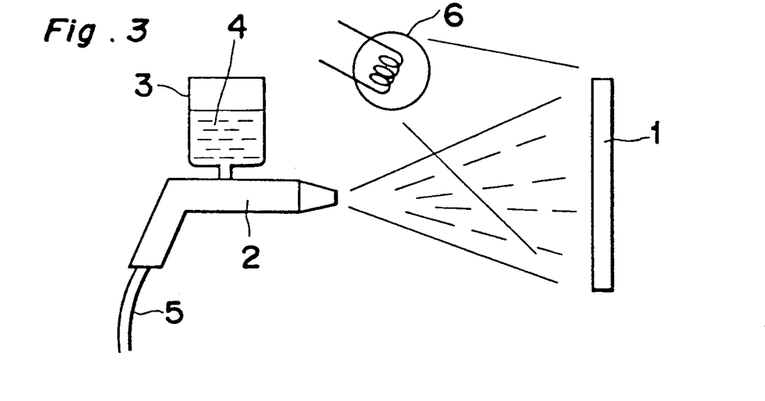
FIG. 3 is a schematic view showing a spray pyrolysis method for forming a superconductive ceramic film to be used for a magnetic sensor of a preferred embodiment according to the present invention.
Figure 5:
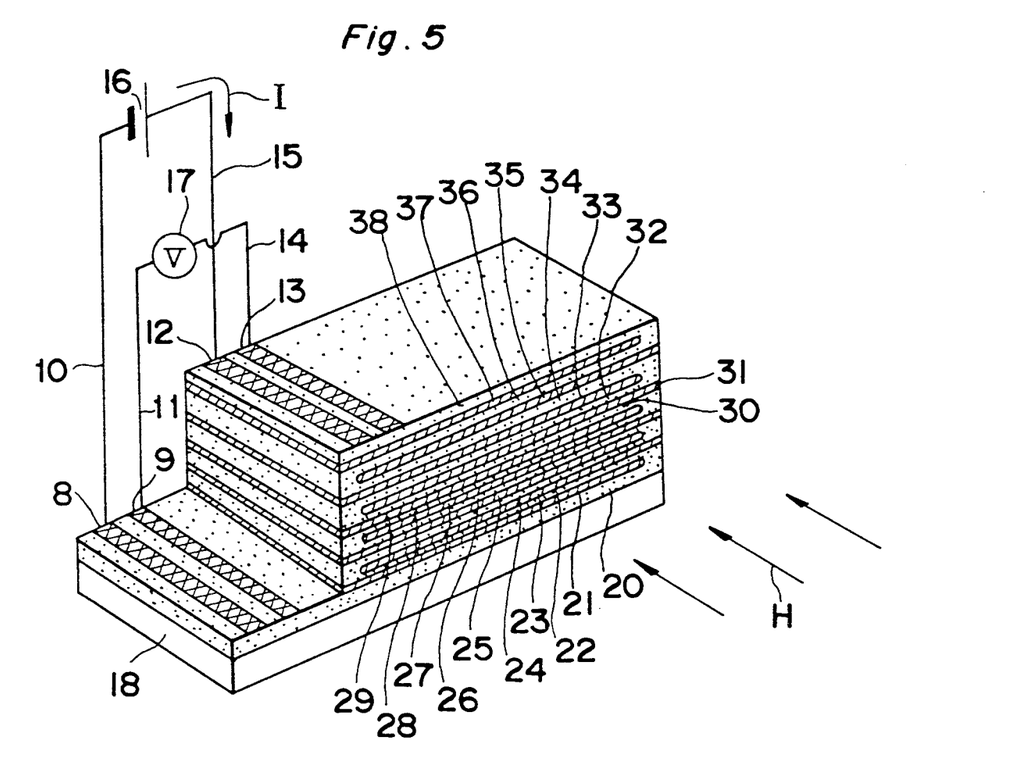
FIG. 5 is a perspective view showing a magnetic sensor utilizing a superconductive magneto-resistive device having a lamination structure of a preferred embodiment according to the present invention.

FIG. 5 shows a magnetic sensor using a superconductive magneto-resistive film of a preferred embodiment according to the present invention. The superconductive magneto-resistive film of Y-Ba-Cu-O ceramic compounds is made by a spray pyrolysis method as shown in FIG. 3 as follows.

In the present preferred embodiment, materials of $Y(NO_3)_3 \cdot 6H_2O$, $Ba(NO_3)_2$ and $Cu(NO_3)_2 \cdot 3H_2O$ are used to form the above-mentioned superconductive magneto-resistive film, and materials of $Y(NO_3)_3 \cdot 6H_2O$, $Ba(NO_3)_2$, $Cu(NO_3)_2 \cdot 3H_2O$ and $Zn(NO_3) \cdot 6H_2O$ are used to form an electrical insulation film.

Powders of $Y(NO_3)_3 \cdot 6H_2O$, $Ba(NO_3)_2$ and $Cu(NO_3)_2 \cdot 3H_2O$ are weighed at a predetermined ratio. Each powder is sufficiently dissolved into pure water so as to prepare an aqueous solution 4 containing Y, Ba, Cu nitrates. The aqueous solution 4 made as described above is put into a container 3 of a spray gun 2, and is sprayed over a stabilized zirconia substrate 1 which is heated by a heating lamp 6, with use of the spray gun 2 using a compressed air 5, with sufficiently stirring so as to form a superconductive ceramic film on the substrate 1 in a well known decomposition and oxidation process of the aqueous solution 4.

Similarly, an electrical insulation film is formed thereon by using powders of $Y(NO_3)_3 \cdot 6H_2O$, $Ba(NO_3)_2$, $Cu(NO_3)_2 \cdot 3H_2O$ and $Zn(NO_3) \cdot 6H_2O$.

FIGS. 4a to 4e show a process for making superconductive films having a lamination structure to be used for a magnetic sensor.

Figure 4A:
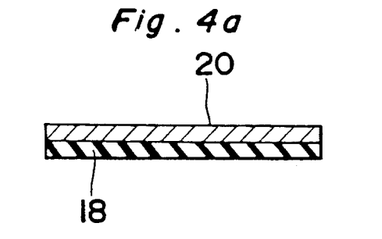
FIGS. 4a to 4e are cross sectional views showing a process for making a superconductive magneto-resistive device having a lamination structure of the present preferred embodiment.

First of all, after powders of $Y(NO_3)_3 \cdot 6H_2O$, $Ba(NO_3)_2$ and $Cu(NO_3)_2 \cdot 3H_2O$ are weighed so that a composition ratio of Y, Ba and Cu becomes 1:2:3, each powder is sufficiently dissolved in pure water so as to prepare a first aqueous solution containing Y, Ba, Cu nitrates. The first aqueous solution made as described above is sprayed over a stabilized zirconia, substrate 18 having a width of 5 millimeters and a length of 20 millimeters which is heated at a temperature in the range from 300° C. to 600° C., and thereafter, it is heated at a temperature in the range from 900° C. to 1000° C. in air at one atmospheric pressure so as to form a superconductive ceramic film 20 of $Y_1Ba_2Cu_3O_y$ ($6.8 \leq y \leq 7.0$) on the substrate 18 as shown in FIG. 4a.

Figure 4B:
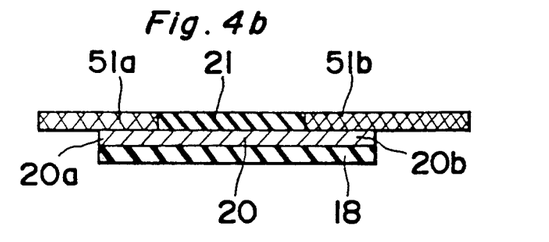

After powders of $Y(NO_3)_3 \cdot 6H_2O$, $Ba(NO_3)_2$, $Cu(NO_3)_2 \cdot 3H_2O$ and $Zn(NO_3) \cdot 6H_2O$ are weighed so that a composition ratio of Y, Ba, Cu and Zn becomes 1:2:2.5:0.5, each powder is sufficiently dissolved in pure water so as to prepare a second aqueous solution containing Y, Ba, Cu, Zn nitrates. The second aqueous solution is sprayed over the top surface of the superconductive ceramic film 20 by the above spray pyrolysis method in such a state that the right and left side portions 20a and 20b of the film 20 are covered by mask films 51a and 51b, respectively, as shown in FIG. 4b, so as to form an electrical insulation film 21 of $Y_1Ba_2Cu_{2.5}Zn_{0.5}O_y$ ($6.8 \leq y \leq 7.0$) having an electric resistance of several $M\Omega$ or more thereon except for the right and left side portions 20a and 20b of the film 20.

Figure 4C:
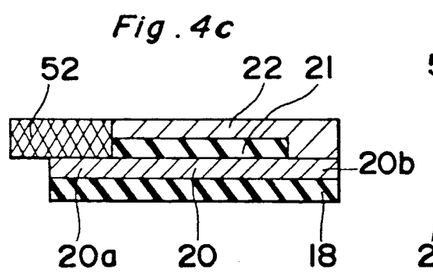
Figure 4D:
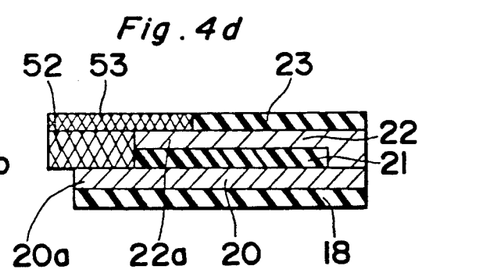
Figure 4E:
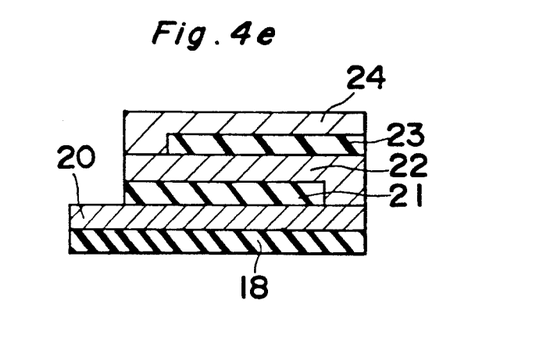

After removing the mask films 51a and 51b, the first aqueous solution which is made as described above is sprayed over the top surface of the insulation film 21 and the top surface of the left side portion 20b of the superconductive ceramic film 20 by the above spray pyrolysis method in such a state that the right side portion 20a of the superconductive ceramic film 20 is covered by a mask film 52, as shown in FIG. 4c, so as to form a superconductive ceramic film 22 thereon except for the right side portion 20a of the film 20. Thereafter, the second aqueous solution which is made as described above is sprayed over the top surface of the superconductive ceramic film 22 by the above spray pyrolysis method in such a state that the right side portion 22a of the superconductive ceramic film 22 is covered by a mask film 53, as shown in FIG. 4d, so as to form an insulation film 23 thereon except for the right side portion 22a of the film 22. After removing the mask film 53, as shown in FIG. 4e, a superconductive ceramic film 24 is formed in the manner similar to that of the process for making the superconductive ceramic film 22 shown in FIG. 4c. Similarly, the process for forming the superconductive ceramic film and the insulation film is repeated so as to form the superconductive ceramic films having a lamination structure to be used for the magnetic sensor shown in FIG. 5.

In the structure of the magnetic sensor, ten superconductive ceramic films 20, 22, 24, 26, 28, 30, 32, 34, 36 and 38 are laminated one by one, and nine electrical insulation films 21, 23, 25, 27, 29, 31, 33, 35 and 37 are formed between the adjacent superconductive ceramic films so as to insulate them except for one end portion of them. The insulation film for insulating the upper pair of the adjacent superconductive ceramic films is formed so as to extend in a direction opposite to that of the lower pair of the adjacent films, resulting in that a folded current path is formed in the magnetic sensor shown in FIG. 5.

Furthermore, respective superconductive ceramic films 20, 22, 24, 26, 28, 30, 32, 34, 36 and 38 which have been made in the above process are electrically connected in series to each other. The lattice constant of each superconductive ceramic film is substantially same as that of each insulation film, and the thermal expansion coefficient of each superconductive ceramic film is substantially same as that of each insulation film. Therefore, in the magnetic sensor, any defect due to the mismatching between the lattice does not occur and any peel between the films does not occur, resulting in that there is obtained the superconductive ceramic films having a lamination structure of a good quality to be used for the magnetic sensor.

On the lower-most and upper-most films 20 and 38, a pair of current electrodes 8 and 12 of Ti and a pair of voltage electrodes 9 and 13 of Ti are formed by the vapor deposition method, respectively. A pair of current electrodes 8 and 12 is connected to a constant-current regulated power source 16 for supplying a constant, current I through lead wires 10 and 15 bonded thereon by Ag paste. A pair of voltage electrodes 9 and 13 is connected to a voltmeter 17 for measuring a voltage generated in the magnetic sensor through lead wires 11 and 14 bonded thereon by Ag paste.

Figure 6:
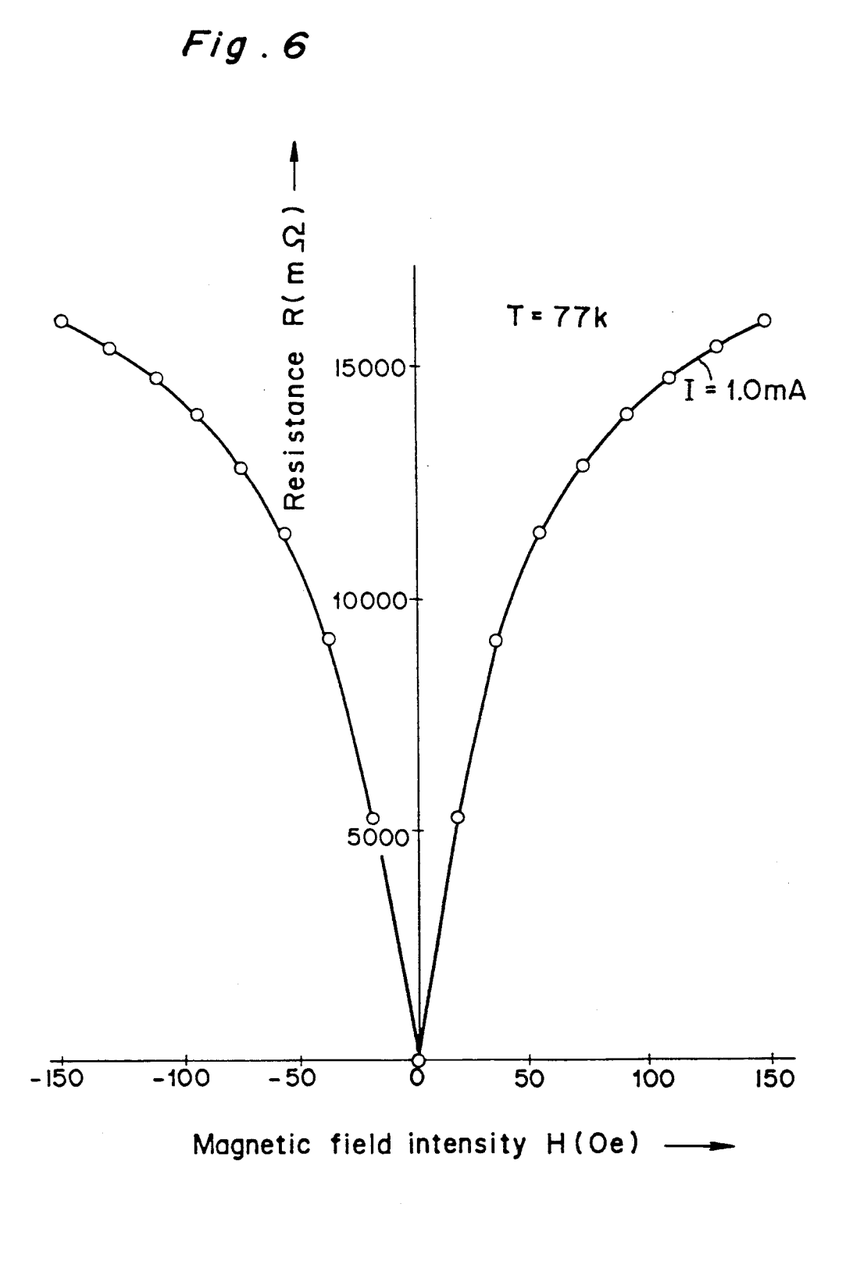
FIG. 6 is a graph showing a magnetic field detection characteristic of the magnetic sensor shown in FIG. 5.

FIG. 6 is a graph showing the result obtained by measurement with use of the magnetic sensor having laminated ten superconductive ceramic films shown in FIG. 5 which is immersed in liquid nitrogen so as to be cooled at 77 K. The thickness of each superconductive ceramic film is 10 μms, and a current of 1 mA is supplied to the magnetic sensor.

Figure 7:
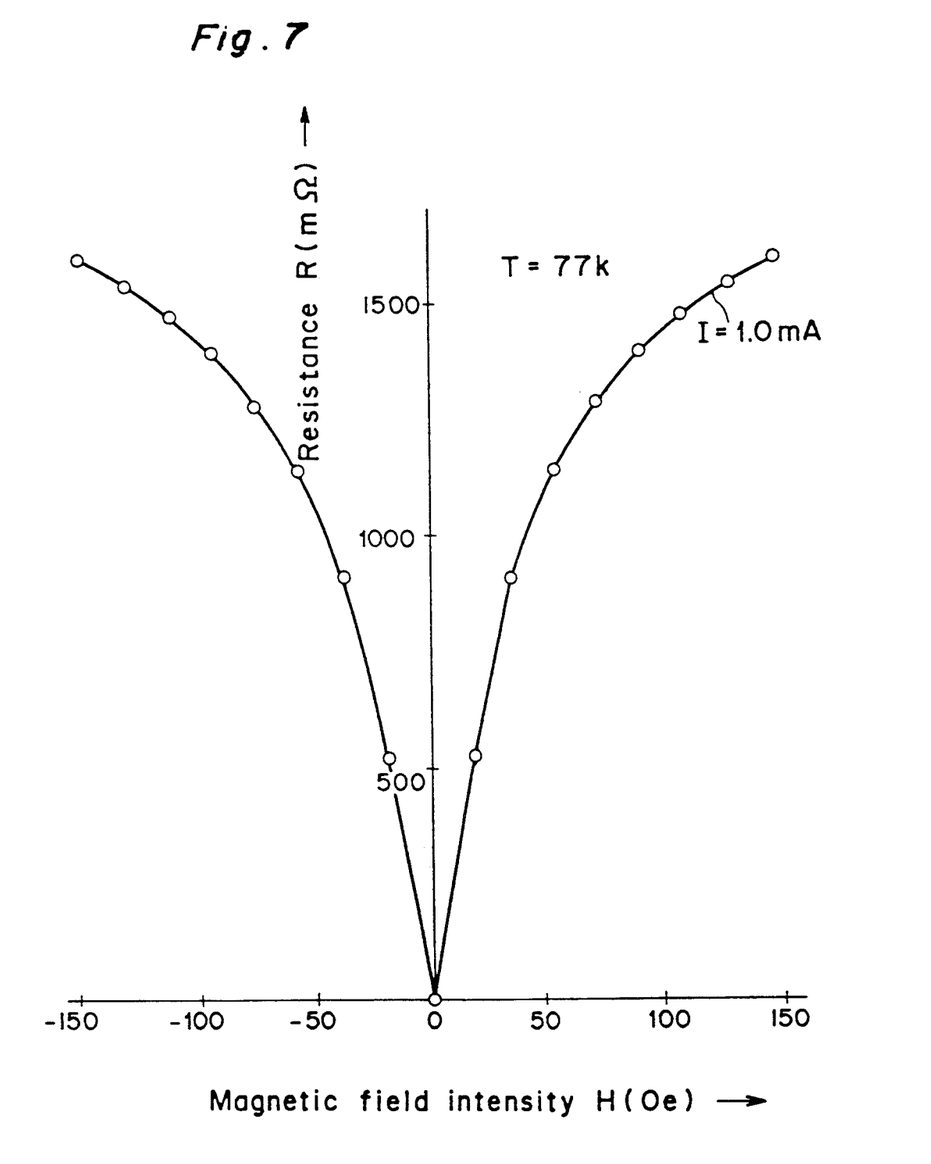
FIG. 7 is a graph showing a magnetic field detection characteristic of a magnetic sensor of a comparative example.

FIG. 7 is a graph showing the result obtained by measurement with use of a magnetic sensor of a comparative example having one superconductive ceramic film which is made in the manner similar to that of the magnetic sensor of the preferred embodiment shown in FIG. 5. The thickness of the superconductive ceramic film of the magnetic sensor of the comparative example is 10 μms, and a current of 1 mA is supplied thereto.

As is apparent from the comparison between FIGS. 6 and 7, when a magnetic filed of 100 Oe is applied in parallel to the plane of the superconductive ceramic film or films of each magnetic sensor, in the magnetic sensor of the preferred embodiment, a voltage of about 14 mV is generated when a measuring current of 1 mA is supplied thereto, and then, the resistance thereof is 14 ω. On the other hand, in the magnetic sensor of the comparative example, as shown in FIG. 7, a voltage of 1.4 mV is generated when a measuring current of 1 mA is supplied thereto, and then, the resistance thereof is 1.4 ω.

As described above, the magnetic sensor of the preferred embodiment according to the present invention generates ten times the voltage generated by the magnetic sensor of the comparative example having only one superconductive ceramic film, resulting in that the magnetic sensor having a high sensitivity is obtained.

In the preferred embodiment, the superconductive ceramic films of $Y_1Ba_2Cu_3O_y$ ($6.8 \leq y \leq 7.0$) and the electrical insulation films of $Y_1Ba_2Cu_{2.5}Zn_{0.5}O_y$ ($6.8 \leq y \leq 7.0$) are used, however, superconductive ceramic films of $Y_1Ba_2Cu_3O_y$ ($6.5 \leq y < 6.8$) and electrical insulation films of $Y_1Ba_2Cu_{2.5}Zn_{0.5}O_y$ ($6.5 \leq y < 6.8$) may be used. In this case, the threshold temperature of the superconductive ceramic films of $Y_1Ba_2Cu_3O_y$ ($6.5 \leq y < 6.8$) at which they changes from the normal conductive phase to the superconductive phase are smaller than the threshold temperature of the superconductive ceramic films of $Y_1Ba_2Cu_3O_y$ ($6.8 \leq y \leq 7.0$).

In the present preferred embodiment, the magnetic sensor having the superconductive ceramic films of Y-Ba-Cu-O compounds is described, however, the present invention is not limited to this. Another magnetic sensor having the superconductive ceramic films of compounds such as $Bi_2Sr_2Ca_{n-1}Cu_nO_{2n+4}$ (n = 1, 2, 3), $Tl_2Ba_2Ca_{n-1}Cu_nO_{2n+4}$ (n = 1, 2, 3, 4, 5, 6), $Tl_1Ba_2Ca_{n-1}Cu_nO_{2n+3}$ (n = 1, 2, 3, 4, 5, 6, 7), which are comprised of superconductive grain boundaries, can be applied to the present invention.

In the present preferred embodiment, the spray pyrolysis method is used for forming a superconductive ceramic film, however, the present invention is not limited to this. The other methods for forming a superconductive ceramic film such as a sputtering method, a CVD method may be used.

It is to be noted that a magnetic sensor comprising the superconductive ceramic films respectively having a smaller thickness has a higher sensitivity, however, when the thickness thereof is equal to or smaller than 0.1 microns a constant magneto-resistive property of the superconductive ceramic film is not obtained because the grains thereof have grown irregularly due to the heating process after forming the superconductive film.

Furthermore, when the thickness of the superconductive ceramic film is equal to or larger than 50 μm, the smoothness of the surface thereof and the sensitivity of the magnetic sensor are lowered because the grains of the superconductor have grown excessively.

In the preferred embodiment, the insulation film of $Y_1Ba_2Cu_{2.5}Zn_{0.5}O_y$ is used for insulating the adjacent superconductive ceramic films, however, the present invention is not limited to this, The ratio of composition of elements constituting the ceramic superconductor may be changed so as to form an insulation superconductive ceramic film suitable for making the magnetic sensor comprising the superconductive ceramic films having a laminating structure. For example, as the superconductive films, a material of compounds such as $A_1Ba_2Cu_3O_y$ ($6.5 \leq y \leq 7.0$) or $A_1Ba_{2-x}Sr_xCu_3O_y$ ($0 \leq x \leq 0.5$, $6.5 \leq y \leq 7.0$) may be used, wherein the above element A is either Lu, Yb, Tm, Er, Y, Ho, Dy, Gd, Eu, Sm or Nd. On the other hand, as the electrical insulation films, a material of compounds such as $Q_1Ba_2Cu_3O_y$ ($6.5 \leq y \leq 7.0$), $Q_1Ba_2Cu_{3-z}M_zO_y$ ($6.5 \leq y \leq 7.0$, $x \geq 0.5$), $Q_1Ba_{2-x}Sr_xCu_3O_y$ ($x > 0.5$, $6.5 \leq y \leq 7.0$), $Q_1Ba_{2-x}Sr_xCu_{3-z}M_zO_y$ ($x > 0.5$, $6.5 \leq y \leq 7.0$, $x \geq 0.5$), $Y_1Ba_2Cu_{3-z}M_zO_y$ ($6.5 \leq y \leq 7.0$, $z \geq 0.5$), $Y_1Ba_{2-x}Sr_xCu_3O_y$ ($x > 0.5$, $6.5 \leq y \leq 7.0$), $Y_1Ba_{2-x}Sr_xCu_{3-z}M_zO_y$ ($x > 0.5$, $6.5 \leq y \leq 7.0$, $z \geq 0.5$) may be used, wherein the above element Q is either Sc, Ce, Pr or Tb, and the above element M is either Fe, Co, Zn, Cr, Ga or Ni.

Figure 8:
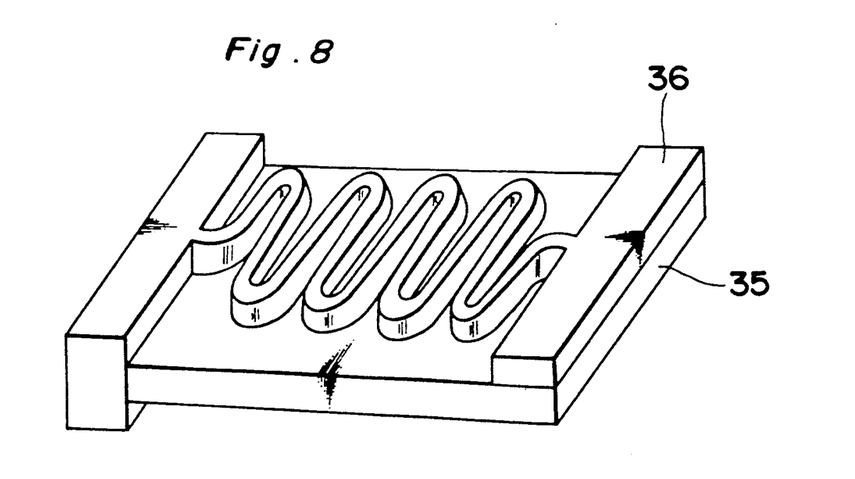
FIG. 8 is a perspective view of a superconductive ceramic film of a modification which is shaped into a zigzag configuration.

The shape of the superconductive ceramic film according to the present invention is not limited to that of the present preferred embodiment shown in FIG. 5. For example, each superconductive ceramic film may be shaped into a zigzag configuration as shown in FIG. 8 by using a photolitograph method etc. and an etching method or a masked film deposition method. In this case, the number of the grain boundaries which are in contact in series can be further increased, resulting in a magnetic sensor having a higher sensitivity.

As described above, there can be obtained the magnetic sensor utilizing the magneto-resistive device constituted by the superconductive ceramic films having a lamination structure according to the present invention which has an extremely high sensitivity and acts at an extremely low consumption power.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A superconductive magneto-resistive device for measuring magnetic fields comprising:
   a block-shaped ceramic superconductor comprised of a plurality of superconductive ceramic films having a magneto-resistive effect on which resistance thereof varies according to a magnetic field intensity being applied thereto;
   said superconductive ceramic films being laminated such that adjacent superconductive ceramic films are insulated from each other by electrical insulation films except for one end portion of each of said adjacent superconductive ceramic films;

said superconductive ceramic films having an upper surface and a lower surface;

said upper surface of said one end portion of a superconductive ceramic film being connected to one end portion of said lower surface of a superconductive ceramic film laminated thereabove, another end portion of said superconductive ceramic film laminated thereabove being connected to a next superconductive ceramic film laminated thereabove, thereby connecting said superconductive ceramic films in series to increase the resistance of the superconductive magneto-resistive device; and a pair of electrodes being arranged on an upper-most superconductive ceramic film and a lower-most superconductive ceramic film.

2. The superconductive magneto-resistive device as claimed in claim 1, wherein each of aid superconductive ceramic films has a thickness in a range from 0.1 microns to 50 microns.

3. The superconductive magneto-resistive device as claimed in claim 1, wherein said electrical insulation film is made by adding one element to a compound of said superconductive ceramic film.

4. The superconductive magneto-resistive device as claimed in claim 1, wherein said electrical insulation film is made by replacing at least one element of a compound of said superconductive ceramic film with another whole or partial element.

5. The superconductive magneto-resistive device as claimed in claim 1, wherein said electrical insulation film is made by changing a ratio of composition of elements of a compound of said superconductive ceramic film.

6. The superconductive magneto-resistive device as claimed in claim 3, wherein said superconductive ceramic film is made of $Y_1Ba_2Cu_3O_y$, and said electrical insulation film is made of $Y_1Ba_2Cu_{2.5}Zn_{0.5}O_y$.

7. The superconductive magneto-resistive device as claimed in claim 1, wherein said superconductive ceramic film is made of Bi-Sr-Ca-Cu-O compound.

8. The superconductive magneto-resistive device as claimed in claim 1, wherein said superconductive ceramic film is made of Tl-Ba-Ca-Cu-O compound.

9. A ceramic superconductor for measuring magnetic fields comprising:

a plurality of superconductive ceramic films;

said superconductive ceramic films being laminated such that adjacent superconductive ceramic films are connected at an end portion; and a plurality of electrical insulation films, each provided between adjacent ones of said superconductive ceramic films except at said one end where said adjacent superconductive ceramic films are connected;

said adjacent superconductive ceramic films being connected at one end portion to one superconductive ceramic film and to another superconductive ceramic film at another end portion, thereby forming a folded current path with said adjacent superconductive ceramic films to increase the resistance of the ceramic superconductor.

10. The ceramic superconductor as claimed in claim 9 further comprising:

a pair of electrodes connected at either end of said folded current path.

11. The ceramic superconductor as claimed in claim 9, wherein each of said superconductive ceramic films has a thickness in a range from 0.1 microns to 50 μm.

12. The ceramic superconductor as claimed in claim 9, wherein said electrical insulation film is made by adding one element to a compound of said superconductive ceramic film.

13. The ceramic superconductor as claimed in claim 9, wherein said electrical insulation film is made by replacing at least one element of a compound of said superconductive ceramic film with another whole or partial element.

14. The ceramic superconductor as claimed in claim 9, wherein said electrical insulation film is made by changing a ratio of composition of elements of a compound of said superconductive ceramic film.

15. The ceramic superconductor as claimed in claim 12, wherein said superconductive ceramic film is made of $Y_1Ba_2Cu_3O_y$, and said electrical insulation film is made of $Y_1Ba_2Cu_{2.5}Zn_{0.5}O_y$.

16. The ceramic superconductor as claimed in claim 9, wherein said superconductive ceramic film is made of Bi-Sr-Ca-Cu-O compound.

17. The ceramic superconductor as claimed in claim 9, wherein said superconductive ceramic film is made of Tl-Ba-Ca-Cu-O compound.

18. A magnetic field sensor comprising:

a block-shaped ceramic superconductor comprised of a plurality of superconductive ceramic films having a magneto-resistive effect on which resistance thereof varies according to a magnetic field intensity being applied thereto;

said superconductive ceramic films being laminated such that adjacent superconductive ceramic films are insulated from each other by electrical insulation films except for one end portion of each of said adjacent superconductive ceramic films;

said superconductive ceramic films having an upper surface and a lower surface;

said upper surface of said one end portion of a superconductive ceramic film being connected to one end portion of said lower surface of a superconductive ceramic film laminated thereabove, an upper surface of another end portion of said superconductive ceramic film laminated thereabove being connected to a lower surface of a next superconductive ceramic film laminated thereabove, thereby connecting said superconductive ceramic films in series to increase the resistance of the superconductive magneto-resistive device.

19. The magnet field sensor as claimed in claim 18, wherein each of said superconductive ceramic films has a thickness in a range from 0.1 microns to 50 microns.

20. The magnetic field sensor as claimed in claim 18, wherein said electrical insulation film is made by adding one element to a compound of said superconductive ceramic film.

21. The magnetic field sensor as claimed in claim 18, wherein said electrical insulation film is made by replacing at least one element of a compound of said superconductive ceramic film with another whole or partial element.

22. The magnetic field sensor as claimed in claim 18, wherein said electrical insulation film is made by changing a ratio of composition of elements of a compound of said superconductive ceramic film.

23. The magnetic field sensor as claimed in claim 20, wherein said superconductive ceramic film is made of $Y_1Ba_2Cu_3O_y$, and said electrical insulation film is made of $Y_1Ba_2Cu_{2.5}Zn_{0.5}O_y$.

24. The magnetic field sensor as claimed in claim 18, wherein said superconductive ceramic film is made of a Bi-Sr-Ca-Cu-O compound.

25. The magnetic field sensor as claimed in claim 18, wherein said superconductive ceramic film is made of a T-Ba-Ca-Cu-O compound.

26. A magnetic field sensor comprising:
a plurality of superconductive ceramic films;
said superconductive ceramic films being laminated such that adjacent superconductive ceramic films are connected at an end portion; and
a plurality of electrical insulation films, each provided between adjacent ones of said superconductive ceramic films except at said one end where said adjacent superconductive ceramic films are connected;
said adjacent superconductive ceramic films being connected at one end portion to one superconductive ceramic film and to another superconductive ceramic film at another end portion located at an opposite side of the sensor, thereby forming a folded current path with said adjacent superconductive ceramic films to increase the resistance of the ceramic superconductor.

27. The magnetic field sensor as claimed in claim 26 further comprising:
a pair of electrodes connected at either end of said folded current path.

28. The magnetic field sensor as claimed in claim 26, wherein each of said superconductive ceramic films has a thickness in a range from 0.1 microns to 50 microns.

29. The magnetic field sensor as claimed in claim 26, wherein said electrical insulation film is made by adding one element to a compound of said superconductive ceramic film.

30. The magnetic field sensor as claimed in claim 26, wherein said electrical insulation film is made by replacing at least one element of a compound of said superconductive ceramic film with another whole or partial element.

31. The magnetic field sensor as claimed in claim 26, wherein said electrical insulation film is made by changing a ratio of composition of elements of a compound of said superconductive ceramic film.

32. The magnetic field sensor as claimed in claim 29, wherein said superconductive ceramic film is made of $Y_1Ba_2Cu_3O_y$, and said electrical insulation film is made of $Y_1Ba_2Cu_{2.5}Zn_{0.5}O_y$.

33. The magnetic field sensor as claimed in claim 26, wherein said superconductive ceramic film is made of a Bi-Sr-Ca-Cu-O compound.

34. The magnetic field sensor as claimed in claim 26, wherein said superconductive ceramic film is made of a T-Ba-Ca-Cu-O compound.

* * * * *